United States Patent [19]

Held

[11] Patent Number: 4,461,823

[45] Date of Patent: Jul. 24, 1984

[54] MULTIPLE TRANSFER OF TACKY IMAGE AREAS USING PROLONGED TACK TONERS

[75] Inventor: Robert P. Held, Englishtown, N.J.

[73] Assignee: E. I. Du Pont De Nemours and Company, Wilmington, Del.

[21] Appl. No.: 420,512

[22] Filed: Sep. 20, 1982

Related U.S. Application Data

[63] Continuation of Ser. No. 124,605, Feb. 25, 1980, abandoned.

[51] Int. Cl.$^3$ ............................................. G03G 5/24
[52] U.S. Cl. .................................... 430/120; 430/124; 430/126; 430/109
[58] Field of Search ................... 430/54, 55, 126, 291, 430/292, 324, 331, 109, 120, 124; 427/265, 201

[56] References Cited

U.S. PATENT DOCUMENTS 3,681,106 8/1972 Burns .................................. 430/120
4,215,193 7/1980 Manger .............................. 430/108

*Primary Examiner*—John E. Kittle
*Assistant Examiner*—John L. Goodrow

[57] ABSTRACT

A surface having tacky images which comprise toner-receptive and background areas can be color developed by applying to the toner-receptive areas a prolonged tack toner, heating the toned image to a temperature sufficient to make the toner tacky, reducing the temperature of the tackified toned image below the tackifying temperature, the toner remaining tacky, and repeating the toner application, heating and cooling steps at least once. The prolonged tack toned image can be used in single or multiple transfers to an image receptor. The transferred image can also be toned with prolonged tack toner to generate an image of higher optical density.

20 Claims, 2 Drawing Figures

MULTIPLE TRANSFER OF TACKY IMAGE AREAS USING PROLONGED TACK TONERS

This is a continuation, of application Ser. No. 124,605 filed Feb. 25, 1980 now abandoned.

TECHNICAL FIELD

This invention relates to a process for the development of latent images. More particularly the invention relates to a dry process for transfer of a toned tacky image to an image receptor. Still more particularly the invention relates to a process for producing multiple transfers using a toner having prolonged tack characteristics, and apparatus therefor.

BACKGROUND ART

Processes are known whereby surfaces bearing latent images are developed through the application of toner particles. For example, in the case where the latent image comprises tacky and nontacky background areas, a conventional toner may be used to develop such image. Once the toner-receptive areas of the latent image are covered completely with toner, it is not possible to apply more toner to increase their density. In some of these processes, the toned latent images can be subsequently transferred to separate image receptors forming images thereon. While multiple copies of the toned images can bemmade, the number of copies is generally few in number, e.g., up to about 5 copies, since the image areas as well as the adhering toner transfer to the image receptors.

Prolonged tack materials prepared from thermoplastic resins in a plasticizer are known which on heating become tacky or sticky and retain this tackiness for a considerable time even after cooling. This property, also known as delayed tack or setting, has been found useful in the preparation of adhesive compositions, as well as in thermography to produce a master which is imagewise exposed by means of heat, toned, and the toned image is then transferred onto an image receptor to provide a copy of the original image. In this described process the prolonged tack property is present in the form of a continuous film over a master sheet. Conventional toners are used to develop the tacky image areas. A subsequent transfer of the toned image onto an image receptor, e.g., paper, results in complete transfer of the toned image.

Apparatus for toner development of thermographic masters are known. One such apparatus has a belt transport which carries a master sequentially past toning, heating, transferring and brush cleaning stations. Also known are laterally vibrating pads to redistribute toner particles and a laterally vibrating toner hopper. Furthermore, a combination air knife/vacuum cleaner for toner removal which can be used in combination with a brush means to improve its efficiency is known. No apparatus is believed to be known which incorporates toning, cleaning, heating and transferring stations wherein a cooling means is provided following the transferring station to cool the master surface prior to retoning of the tacky image.

BRIEF DESCRIPTION OF DRAWINGS

In the accompanying drawings forming a material part of this disclosure

DISCLOSURE OF INVENTION

Figure 1:
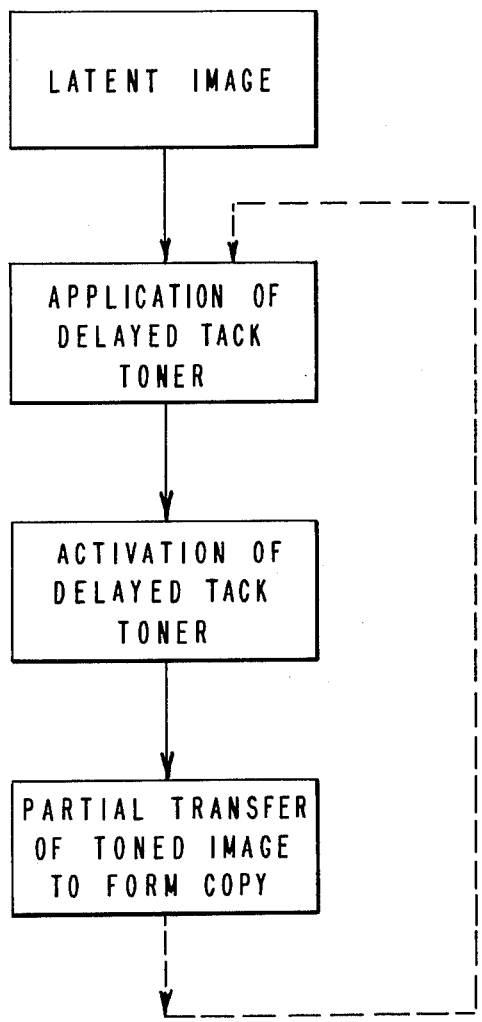
FIG. 1 is a flow sheet showing an image transfer embodiment of the invention.

In accordance with this invention there is provided a process for image development of a substrate having a latent image, said image having toner-receptive and background areas, which comprises (a) applying to the latent image a prolonged tack toner to produce a nontacky toned image;

(b) heating the toned image to a temperature sufficient to activate the toner by rendering the toner tacky, (c) reducing the temperature of the image below the activating temperature of the prolonged tack toner wherein the activated toner remains tacky, (d) further applying prolonged tack toner to the tackified toned image, and (e) repeating steps (b) through (d) at least one time to increase the density of the toned image on the substrate.

In accordance with another embodiment of this invention there is provided a process for forming a toned image from a substrate master having a latent image, said image having toner-receptive and background area, which comprises (a) applying to the latent image of the substrate a prolonged tack toner to produce a nontacky toned image, (b) heating the toned image to a temperature sufficient to activate the toner by rendering the toner tacky, (c) bringing the tacky toned substrate into intimate contact with an image receptor, and, while the toner is still activated, (d) separating the substrate and image receptor whereby a portion of the activated toner transfers imagewise to the image receptor.

In accordance with still another embodiment of this invention there is provided an apparatus for the production of multiple copies from a substrate master having tacky toner-receptive areas and nontacky background areas onto an image receptor which comprises support means for the substrate capable of sequentially and cyclically transporting the substrate, in order, past the following station located adjacent to the support means:

(1) a toner applicator to apply a uniform layer of prolonged tack toner particles onto the tacky toner-receptive areas of the substrate;

(2) a toner cleaner extending the full width of the support means comprising an air knife and at least one vacuum nozzle located in close proximity to the air knife for removing toner particles dislodged from the nontacky background areas of the substrate by the actionoof the air knife; optionally (3) a cleaning belt held in contact with the support means and extending the full width of the support means capable of vibrating in a direction transverse to the direction in which the toned substrate is transported, (4) heating means for heating the toned substrate to raise the temperature of the prolonged tack toners above the temperature at which the toners become tackified;

(5) an image transfer means comprising rollers for bringing the tacky toned substrate into intimate contact with the image receptor, and (6) a cooling air supply extending the full width of the support means for providing cooling air over the toned substrate to reduce the temperature of the prolonged tack toners and background areas below the temperature at which the toners become tackified, the cooling air supply being located ahead of station (1).

Referring to the drawings, and more particularly to FIG. 1, this figure shows, in the form of a flow sheet, the basic steps of a preferred embodiment of the invention wherein multicopies of a toned image, i.e., toned with prolonged tack toners, are transferred to separate image receptors. The latent image is present in a substrate. As used in this specification, latent image means any image capable of being developed through the application of toner particles, including, but not limited to, electrostatic, electromagnetic, or images comprising tacky areas and nontacky background areas.

This invention will be further illustrated using the particular case of a latent tacky image. Such image comprises tacky toner-receptive areas and nontacky background areas. Suitable substrates are supported layers which are capable of forming tacky images on their surface, either directly, e.g., by exposure to actinic radiation, or by treatment with solutions, heat, or other means. Preferably the tacky images are formed in photosensitivity layers which may be comprised of positive-working or negative-working compositions. Suitable positive-working compositions are photohardenable, e.g., photopolymerizable compositions disclosed, for example, in Chu and Cohen U.S. Pat. No. 3,649,268, and suitable negative-working compositions are disclosed, for example, in Abele and Grossa U.S. Application Ser. No. 971,664, filed Dec. 21, 1978 now U.S. Pat. No. 4,243,741, and Cohen and Fan U.S. Pat. No. 4,174,216.

The terms "photopolymerizable" and "photohardenable" as used herein refer to systems in which the molecular weight of at least one component of the photosensitive layer is increased by exposure to actinic radiation sufficiently to result in a change in the rheological and thermal behavior of the exposed areas.

The term "prolonged tack toner" as used herein refers to toners which are nontacky at normal room temperatures but which upon heating to an elevated temperature become and remain tacky for a period of time even though the temperature of the toner returns or is returned to a temperature, below the temperature at which the toner became tacky, including room temperature. Such toners are sometimes referred to as delayed tack toners. Suitable prolonged tack toners having the aforementioned properties can be prepared by combining a thermoplastic resin, e.g., polystyrene, with a plasticizer or heat activatable tackifying agent such as N-cyclohexyl-p-toluenesulfonamide or a copolymer of methylmethacrylate(90)/methacrylic acid(10) and triphenyl phosphate plasticizer, styrene maleic anhydride copolymer and triethyleneglycol dibenzoate, etc. in a proportion such that the plasticizer component is present in an amount greater than its compatibility level in the resin. A dye or colored pigment, e.g., carbon black, can be combined with a resin/plasticizer component, colorant and particles having a size distribution within the range of 0.2 to 30 micrometers and not more than 50% of the colorant particles being less than 1 micrometer particle size as described in U.S. Pat. No. 3,620,726, etc. Other suitable additives to the toner are disclosed in U.S. Pat. No. 3,649,268 referred to above, and in U.S. Pat. No. 3,060,025.

Among suitable photopolymerizable or photohardenable compositions are: (1) those in which a photopolymerizable monomer is present along or in combination with a compatible binder, or (2) those in which the photopolymerizable groups are attached to a polymer backbone which becomes activated to light and may then crosslink by reacting with a similar group or other reactive sites on adjacent polymer chains. In the second group of suitable photopolymerizable systems, where the monomer or pendant photopolymerizable group is capable of addition polymerization, e.g., a vinyl monomer, the photopolymerized chain length may involve addition of many similar units initiated by a single photochemical event. Where only dimerization of similar compounds is involved, e.g., benzophenone or cinnamoyl compounds, the average molecular weight of the photosensitive constituent can be at best only doubled by a single photochemical act. Where a photopolymerizable molecule has more than one reactive site, a crosslinked network can be produced.

If either a simple monomer or monomer-polymer binder composition is being used, the photosensitive layer preferably contains a free radical generating, addition polymerization initiator. Plasticizing agents, as well as other known additives, can be present in the photosensitive layer.

Suitable free radical initiated, chain propagating, addition polymerizable, ethylenically unsaturated compounds for use in the monomer or monomer-polymer binder photopolymerizable layers are described in U.S. Pat. Nos. 3,060,023, 3,261,686 and 3,380,831. Polymers for use in the monomer-polymer binder system and preferred free radical generating addition polymerization initiators are described in U.S. Pat. No. 3,060,023.

Photodimerizable materials useful in the invention are cinnamic acid esters of high-molecular weight polyols, polymers having chalcone and benzophenone type groups, and others disclosed in Chapter 4 of "Light-Sensitive Systems" by Jaromir Kosar published by John Wiley & Sons, Inc., New York, 1965. Photopolymerizable materials capable of photocrosslinking with more than one adjacent polymeric chain to form a network are described in U.S. Pat. Nos. 3,418,295 and 3,469,982.

Preferred free radical generating addition polymerization initiators, activatable by actinic radiation, e.g., ultraviolet and visible radiation, are listed in U.S. Pat. No. 3,060,023 and the other patents referred to above.

Suitable plasticizers include: dialkyl phthalate, polyoxyethylene(4)monolaurylether, polyethylene glycol, triethylene glycol diacetate, alkyl phosphates, etc.

The photosensitive layer, 0.0003 to 0.004 inch (0.0076 to 0.10 mm) thick, can be present on a surface such as a polymer film, plastic, metal or sheet such as paper, whereon it adheres. The photosensitive composition can be either laminated or coated on the surface under conditions known to those skilled in the art. A known protective film such as is described in U.S. Pat. No. 3,060,026, can be present on the photosensitive layer. The protective film, e.g., polyethylene terephthalate, polyethylene, etc., can be present during imagewise exposure but is removed prior to application of the prolonged tack toner to the tacky imaged surface.

The photopolymerizable layer is exposed to actinic radiation, generally through a process transparency, e.g., a process negative or positive (an image-bearing transparency consisting solely of substantially opaque and substantially transparent areas where the opaque areas are substantially of the same optical density).

Since photosensitive compositions of this invention generally exhibit their maximum sensitivity in the ultraviolet range, the radiation source should furnish an effective amount of this radiation. Such sources include carbon arcs, mercury-vapor arcs, fluorescent lamps with special ultraviolet-emitting phosphors, argon glow lamps, electronic flash units and photographic flood lamps. The amount of exposure required for satisfactory reproduction of a given photosensitive layer is a function of intensity, type of radiation source used, and distance between the radiation source and layer surface. In general, exposure times range from 10 seconds to 10 minutes or more using standard commercial radiation sources.

Subsequent to the formation of the latent image, and removal of any cover sheet, if present, the tacky image areas are toned with particles of a prolonged tack toner, of the type described above. The toner particles adhere primarily in the tacky image areas. Any toner particles which should remain in the nontacky background areas can be removed by means known in the art, e.g., wiping, air devices, etc. The prolonged tack toner particles are then activated by heating the toner particles to at least a temperature wherein the toner particles become tacky. The activated tacky toned image-bearing substrate is brought into intimate contact, e.g., under pressure, with an image receptor, e.g., paper, film, copper clad fiberglass epoxy or phenolic resin board, etc. Upon separation of the two surfaces, the toner fails cohesively and a portion thereof transfers imagewise to the image receptor. After reducing or permitting the temperature of the prolonged tack toner particles to be reduced below their activating temperature, wherein the prolonged tack toner particles remain tacky for a period of time, the process can be repeated, as shown by the dotted lines in FIG. 1 using a new image receptor to receive each additional transferred image.

In order to practically illustrate the above-described process, a photopolymerizable element, such as is described in Example I of U.S. Pat. No. 3,736,138, is used, e.g., having a 0.0004 inch (0.010 mm) photopolymerizable layer coated on a 0.007 inch (0.18 mm) resin subbed polyethylene terephthalate support, with the other side of the photopolymerizable layer covered with a 0.001 inch (0.025 mm) polyethylene terephthalate film as a cover sheet. The element is placed in a vacuum frame, a halftone positive is placed over the photopolymerizable layer, and following the application of vacuum for one minute, the element is exposed to actinic radiation for about 20 seconds using a nuArc "Flip Top" Plate Maker, Model FT-26-L pulsed xenon light source. After exposure, the exposed element is removed from the vacuum frame and the cover sheet is removed.

The photopolymerizable layer exhibits a higher degree of tackiness in the areas which received less actinic radiation, thus presenting a latent image which is rendered visible through the application of toner particles. When toner particles are uniformly distributed over the imaged layer, the particles adhere to the tacky portions of the imaged layer. A device such as disclosed in U.S. Pat. No. 4,019,821 is useful for the uniform application of toner particles onto such an imagewise tacky surface, since by its use the toner particles remain solely in the tacky image areas with the nontacky background areas being toner free.

The aforementioned use of a photopolymerizable element such as taught in U.S. Pat. No. 3,736,138 and a toning device such as disclosed in U.S. Pat. No. 4,109,821 is merely illustrative. For the practice of this invention, as noted above, all that is necessary is an image capable of accepting a prolonged tack toner of the type disclosed below and some method for applying the toner thereon.

In particular, when an automatic apparatus is used in conjunction with this process, the toner application may be accomplished in any of a number of ways known in the art. A typical toner applicator is shown in FIG. 1 of U.S. Pat. No. 3,260,612; an applicator of the type disclosed in U.S. Pat. No. 3,013,878 may be employed. A simple applicator as shown in U.S. Pat. No. 3,965,478 may also be used, while the use of a more sophisticated version such as shown in U.S. Pat. No. 3,670,701 is also useful.

Figure 2:
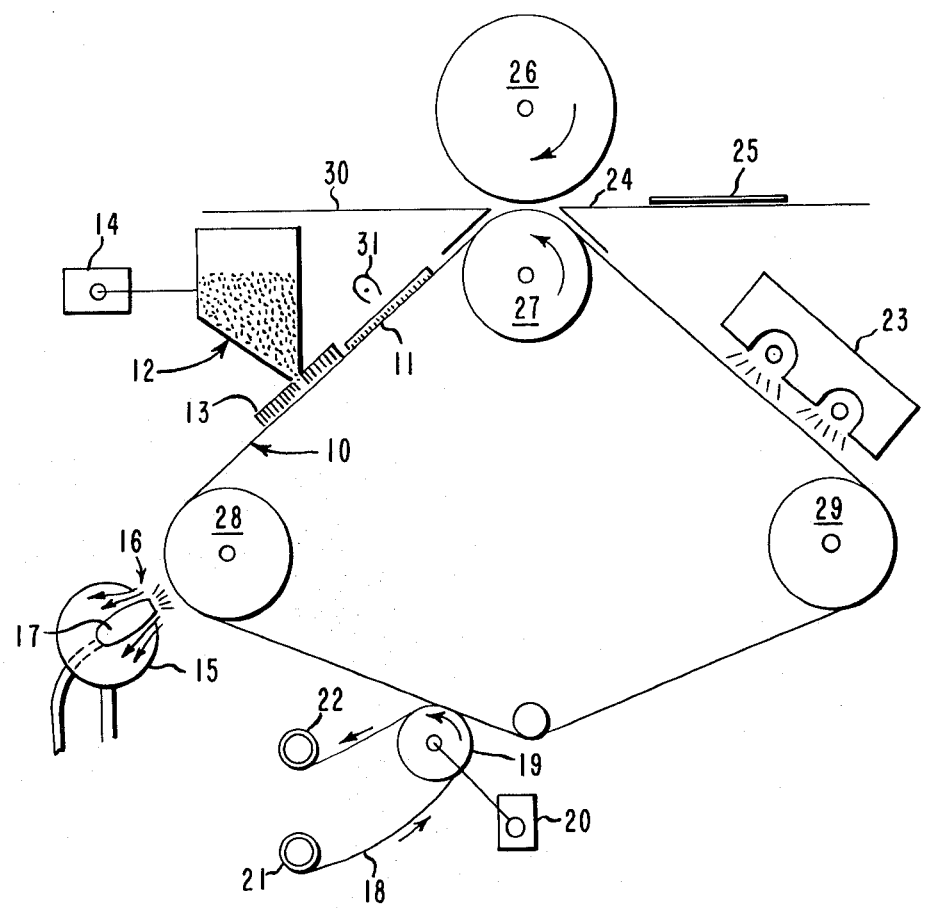
FIG. 2 is an elevation with parts in section showing the various parts of an apparatus for practicing this invention wherein a latent image having a tacky toner-receptive and nontacky background areas is employed.

FIG. 2 shows the various parts of one embodiment of an apparatus of the invention for the automatic implementation of the image transfer embodiment. While a belt support means for the photosensitive substrate is shown to receive, support and transport the substrate containing the latent image past the various treatment stations, a drum can be readily substituted for the belt.

An imaged substrate master 11, hereinafter referred to as "master", of the type described above is first affixed onto carrier belt 10 at a point ahead of toner hopper 12. As the master enters the toner application station, designated station 1, the hopper is activated and toner is delivered onto the master surface. A vibrating driving means 14 is used to impart a vibratory motion to a wall of the hopper and to brush 13 attached to the lower end of the hopper wall. This vibratory motion which is generally in a direction transverse to the direction of motion of master 11 is useful in maintaining agitation of the toner in the hopper and assuring an even flow distribution. Additionally, brush 13 which is located close enough to the carrier belt 10 so that master 11 is driven in contact with the brush bristles, serves to simultaneously redistribute the toner particles over the imaged surface, improving the adhesion of toner particles onto the tacky portion of master 11 while removing toner particles from the nontacky areas.

Following the application of toner particles, master 11 is brought under the action of toner cleaner 15, designated station 2. As illustrated, two vacuum suction ports 16 surround air knife 17. Air knife 17 blows air forcibly over the toned master surface, removing loose toner particles from the surface, which are suctioned away through ports 16.

Optionally a cleaning belt station, designated station 3, is located in the apparatus after the toner cleaner 15. It consists essentially of a Las-tik cloth wiper 18 which is brought into contact with the toned master surface under light pressure provided by roller 19. Roller 19 is adapted to rapidly oscillate by means 20 in a direction transverse to the master advance and to slowly rotate around its axis, constantly supplying a clean cloth to the master surface from a cloth supply spool 21. A take-up spool 22 is provided to take up the spent cloth which is stained with remaining loose toner particles removed from the master surface.

Following the toning and thorough cleaning operations, the surface of the master is exposed to sufficient heat to activate and tackify the toner particles by passing it under a heating means 23, designated station 4, which may comprise infrared or other type heaters.

Upon exposure to the heat, the toner particles, which up to this point are hard, become fluid and tacky. As described above, the toner composition is such that the toner particles remain tacky following activation, e.g., for a period of time which may vary from a few minute or seconds to hours or days. This tackiness is maintained even though the toner temperature drops below the tackifying temperature.

Following toner activation, the master enters station 5 where its surface is brought into contact, under pressure, with an image receptor 25, e.g., paper, etc. between pressure roller 26 and support roller 27. A means 24 and 30 are provided to guide the image receptor in and out of contact with the master surface. Upon contact with the surface of the image receptor 25, the tackified toner partially transfers onto the surface of the receptor. It is important that the adhesive force between the tackified toner and both the master and receptor surfaces be greater than the cohesive force between the tackified toner particles. Thus, when the image receptor is removed from contact with the master, the toner breaks cohesively and a portion of the toner remains on the master while another portion remains adhered to the image receptor to provide a visible image of the original.

The master surface remains on the carrier belt and is again driven by rolls 28 and 29 past the toner application station 1. Just ahead of the toner application station is situated a cooling air supply 31, designated station 6, thus assuring that the master surface temperature of the toned and background areas is reduced to below the tackifying temperature of the toner. This is necessary, since it is desired that the new toner particles remain nontacky so as to prevent smearing after they contact the master surface, adhering only to the previously tackified toner still remaining on the master. The cooling air supply 31 comprises a nozzle attached to a cold air source (not shown).

The process can be repeated as many times as desired, each time providing a high quality copy on a new image receptor and regenerating a tacky image for additional toner application.

Best Mode for Carrying Out the Invention

The best mode is illustrated in Example 12 wherein the toned image of Example 1 is transferred to an aluminum plate to produce a printing plate as described in Example 7. The transferred image is treated with an aqueous solution of triethanolamine titanate chelate, and the treated plate is heated to at least 150° C. After attaching the plate to a duplicating machine, many thousands of inked impressions are made.

Industrial Applicability

The invention is useful for the preparation of toned images of high optical density wherein a tackified toned image on a substrate master is retoned with additional toner a number of times, so as to build the image density on the master surface to any desired point. This is particularly useful in applications where the tacky image has been created on a transparent support such as a polyethylene terephthalate film of the type disclosed in U.S. Pat. No. 2,779,684. When a toned image is developed on a transparent base material, it tends to be translucent due to the fact that it is difficult to apply a thick enough layer of toner particles, to prevent light from shining through the transparent base. A thick enough layer cannot be applied in one toning operation because once the tacky image is covered with toner it ceases to accept any more as its tackiness is masked by the first toner layer. However, by the use of this process where each toner layer itself becomes toner receptive, a sufficient number of layers may be sequentially added onto each other to provide the needed opacity or higher density without significant resolution loss.

The substrate master, instead of being tacky, as described above, can contain latent images that are magnetic or electrostatic. These latent images are toned with prolonged tack toners having magnetic or electrostatic properties, respectively, and subsequently the toners can be transferred to a support and used as described above. Alternatively the toners can be heated to activate the toner's tack, retoned with the same or a different toner to increase toner coverage, and, optionally, transferred to a receptor.

The prolonged tack toned image of the types described above can be used in single or multiple transfers to an image receptor using the same or different toners. The transferred image can also be toned subsequently with additional prolonged tack toner to generate a higher density transferred image. Multicolored images can be prepared on a single image receptor by preparing a desired number of photosensitive elements, e.g., up to four, exposing each element through a different color separation transparency and toning each tacky element with the appropriately colored prolonged tack toner. Each toned image is then transferred in register to the same image receptor.

Resist images can be formed by transferring the toned image to copper clad laminates, e.g., phenolic resin or fiberglass epoxy boards, for example, and subsequently etching or plating the boards in the conventional manner.

Lithographic printing plates can also be prepared by transferring the toned image to a lithographic surface, e.g., an aluminum plate. The transferred image is then treated and inked to produce inked impressions of the image. It is preferred that after transfer of the image, the image is heated up to about 150° C. and more preferably following treatment with triethanolamine titanate chelate or other crosslinking agents. Still better results are achieved when, after transfer while the image is still tacky and prior to heating, the toned image is retoned with a different toner containing polymer particles, e.g., polystyrene beads, pigmented polymers with maximum average diameter of about 50 microns, etc.

Examples

The following examples illustrate the invention. Parts and percentages are by weight.

Example 1

Preparation of Photohardenable Element

On a 0.007 inch (0.18 mm) polyethylene terephthalate film base coated with a resin sublayer, there is coated a photohardenable layer having a thickness of 0.0004 inch (0.01 mm). The photohardenable layer is of the following composition:

| Component | Parts |
| --- | --- |
| Polymethylmethacrylate, high molecular weight | 19.30 |
| Polyvinyl acetate, high molecular weight | 19.30 |
| Trimethylol propane trimethacrylate | 40.60 |
| Polyoxyethylated trimethylol propane triacrylate | 9.10 |
| Polyethylene glycol[4] lauryl ether | 9.10 |
| 2-o-chlorophenyl bisphenyl-imidazolyl dimer | 1.60 |
| 2,2'-dihydroxy-4-methoxy benzophenone | 0.08 |

| Component | Parts |
| --- | --- |
| 2-(stilbyl-4")-(naphtho-1',2'4, 5)-1,2,3-triazole-2"-sulfonic acid phenyl ester | 0.20 |
| 2-mercaptobenzothiazole | 0.80 |

Over this coated layer, there is laminated a cover sheet of 0.00075 inch (0.02 mm) polypropylene to form a photohardenable element.

Exposure of Photohardenable Element

The photohardenable element was placed in a vacuum frame, with the cover sheet facing the glass cover of the vacuum frame. A transparency bearing a positive halftone image of the subject to be reproduced was then placed over the cover sheet, and the vacuum frame glass cover closed. Vacuum of about 25 inches of water ($\sim$635 kg/m$^2$) was applied assuring intimate contact between the transparency and the element. Using a 2 KW "Flip Top" pulsed xenon exposure unit, the sample was exposed to the pulsed source actinic output for a period of about 25 seconds. As a result of the exposure to actinic radiation, the photohardenable surface exhibits imagewise tacky (unexposed) and nontacky (exposed) areas.

The element was then removed from the vacuum frame, and the cover sheet peeled off. The exposed element was mounted on an apparatus such as is depicted in FIG. 2 and was driven past a toner applicator station where toner particles were applied over the exposed photohardenable surface. Toner particles adhere to the tacky portions and the remaining toner was wiped off the element as it progressed through the cleaning stations of the apparatus, the toner cleaner and cleaning belt.

Preparation of Toner and Toning of Exposed Photohardenable Element

The toned element was then subjected to heating whereby the toner particles were heated to a temperature above 50° C. At that temperature the toner particles become tacky. The particular toner used is a prolonged tack toner, and maintains its tackiness following heat activation even if the temperature is subsequently reduced to below 50° C. The prolonged tack toner comprises:

| Component | Parts |
| --- | --- |
| Triphenyl phosphate (plasticizer) | 50.4 |
| Polymethylmethacrylate(90%)/methacrylic acid (10%) (binder) | 41.2 |
| Carbon black | 8.4 | and is prepared as follows:

A solution is first made of the plasticizer and binder components in a solvent mixture of 50% acetone and 50% methanol in which the carbon black has been dispersed. The solution is added under rapid agitation into water at a pH of 4 and relative water to solution volumes of 10/1. Following mixing, the precipitated material is filtered and dried at a temperature below that of the melting point of the toner. It is then ground up in the presence of dry ice to a particle size appropriate for use.

Image Transfer

The element temperature was reduced to below 50° C. by means of a cooled air flow and the element was driven past the toner applicator station for a second time. More toner was applied which adhered to the now tacky toner on the surface of the element. The process was repeated 2 or 3 times to increase the thickness of toner layer on the element, at which time transfers to an image receptor were initiated.

Transfers were accomplished by feeding a sheet of Kromekote ® paper into the nip between rollers 26 and 27 of FIG. 2 in contact with the activated toned surface of the element. Toner particles adhered to the paper by failing cohesively and transferring a portion of the toned image from the element onto the paper surface reproducing the image on the element. Additionally, toner remained on the surface. This surface was again cooled and transported past the toner applicator station for the addition of more toner. The image transfer was repeated 20 times.

Example 2

Four color separation halftone transparencies, i.e., magenta, yellow, cyan and black, were prepared in order to illustrate multicolor image reproduction capability. Using the four transparencies, four color separation tonable elements were prepared using a photopolymerizable element of the type described in Example 1. Each tonable element was then hand toned using a pad which was first dipped into a pan containing a prolonged tack toner of the appropriate color indicated above. The particular prolonged tack toners used were prepared by mixing the toner indicated with 15 g of Santicizer ® 1H, N-cyclohexyl-p-toluenesulfonamide except that the black toner contained 25 g of the sulfonamide compound:

| Yellow toner | 7.5 g of Xerox ® yellow toner No. 6R194 |
| --- | --- |
| Cyan toner | 7.5 g Xerox ® Cyan toner No. 6R192 |
| Magenta toner | 7.5 g Xerox ® Magenta toner 6R198 |
| Black toner | 7.5 g Xerox ® toner 6R208 |

Each toner was prepared by placing the two components in a microgrinder and grinding the mixture to a fine uniform looking powder. After toning, the magenta-toned color separation element was heated (by wrapping around a container filled with hot water) to a temperature sufficient to melt the toner (at least 83° C.). After melting of the toner the magenta-toned color separation element was placed over a paper image receptor, and both the element and image receptor were transported through a heated laminator. The process was repeated using the yellow, cyan and black color separation elements in that order to provide a multicolored image on the image receptor.

The color separation tonable elements, after separation from the image receptor were cooled (the magenta-toned color separation element only was left to detackify over a weekend), retoned and reheated to melt the toner. The process was repeated using the same set of color separation elements to provide five multiple multicolored copies of the original.

Example 3

A photopolymerizable element as disclosed in Example 1 was exposed imagewise and placed on an apparatus of the type shown in FIG. 2. The exposed surface was toned using the toner of Example 1, excess toner was removed, and the adhered toner heated. The toned element was brought into contact with a sheet of plain white paper in the nip between rollers 26 and 27, transferring part of the melted toner onto the paper sheet in imagewise fashion. The toned photopolymerizable element was then cooled and retoned, and the process was repeated at least five more times, producing 5 additional quality copies.

Example 4

Using the photopolymerizable element and equipment described in Example 1, an imagewise tacky surface was generated and the tacky surface was developed by toning with a prolonged tack toner prepared from 12 g of triphenyl phosphate, 8 g of polymethylmethacrylate/methacrylic acid as described in Example 2, and 16 g of Tipure ® R900ED, a form of TiO$_2$ pigment available from E. I. du Pont de Nemours and Company. The image on the photohardenable layer appeared weak and lacked sufficient density. Rather than proceeding to transfer this image onto an image receptor, the toning process was repeated following heating and cooling until an image of satisfactory density was produced on the photohardenable layer.

Example 5

Example 3 was repeated through the image development step using a prolonged tack toner of the following composition:

| Component | Amount (g) |
| --- | --- |
| Polymethylmethacrylate/methacrylic acid described in Example 1 | 280.8 |
| Triethylene glycol dibenzoate | 547.9 |
| Carbon black dispersion, 48% solids | 154.0 |

Following the heating step, the image was transferred to a lithographic aluminum sheet support to provide a good image. The toned element was cooled to a temperature below the melting point of the toner, the toned element was retoned and reheated and a second transfer to another aluminum sheet support was accomplished successfully. The process was repeated six more times giving comparable results.

Example 6

Example 3 was repeated through the image development step using a prolonged tack toner (A) comprising high molecular weight polystyrene beads (6 g) and N-cyclohexyl-p-toluenesulfonamide described in Example 2 (25 g). The toned element was heated to a temperature above the melting point of the toner, followed by cooling below the toned melting point and retoning with the same toner. The retoned element was again cooled but this time to a temperature below the melting point of a second toner (B) being a physical mixture of Xerox ® toner 6R208 (7.5 g) and the sulfonamide compound described above (25 g). The cooled, retoned element was now toned with toner (B) and heated to a temperature of between 110° to 120° C. and then brought into contact under pressure with a copper clad phenolic resin board or fiberglass epoxy board whereby upon separation of an image comprised of toner (B) was transferred to the surface of the board. The process of cooling, toning with toner (B), reheating and transferring the toned image to different copper clad boards was repeated 20 times.

Example 7

Example 3 was repeated through the image development step using a 50:50 mixture of the following toners:

| Component | Amount (g) |
| --- | --- |
| (A) Triphenyl phosphate | 360.0 |
| Polymethylmethacrylate/methacrylic acid described in Example 1 | 240.0 |
| Victoria ® Pure Blue B.O. (C.I. No. Basic Blue 7) | 1.5 |
| (B) Triphenyl phosphate | 360.0 |
| Polymethylmethacrylate/methacrylic acid described in Example 1 | 240.0 |
| Carbon black | 218.0 |

Toned image transfers were effected as follows:

An aluminum plate suitable for the preparation of a lithographic printing plate having a silicate coated surface was preheated to 72° C. The photopolymer toned element was then heated to 85° C. and brought into intimate contact with the preheated plate under high pressure in a nip formed by two rollers. A uniform looking image was transferred onto the aluminum plate. The transferred images were subsequently heat treated to 150° C. for 5 minutes. A gum arabic scrubbing and cleanser solution was wiped on the transferred images. The transferred images were then used as lithographic printing plates to produce 12,500 inked impressions.

Example 8

Example 7 was repeated except that while the image transferred to the aluminum plate was still tacky, it was retoned with polystyrene beads of 1 to 15 micrometers particle size, the average being about 3.5 micrometers. The toned image was heat treated at 160° F. (71° C.) for about 5 minutes. Greater than 12,500 ink printing impressions were made, the toned image exhibiting good wear resistance.

Example 9

Example 1 was repeated except that the prolonged tack toner was transferred onto a copper clad phenolic resin board of the type used in the making of printed circuits. The circuit board containing the image was heated to 82.2°±5° C. While the toner was still tacky, it was retoned once with Xerox ® toner 6R208. It was then heated further, to the melting point of this second toner. After cooling, the board was etched and the toner image removed by washing with methylene chloride solvent to provide a printed circuit board having a copper design corresponding to the original image. Similar results were obtained using a copper clad fiberglass epoxy board in place of the copper clad phenolic resin board.

Example 10

Example 1 was repeated except that the prolonged tack toner was transferred onto a 0.007 inch (0.18 mm) polyethylene terephthalate film. The transferred image was retoned, heated to a temperature of 82° C. whereby the toner was tackified. The toned image was cooled and retoned. The average optical density of the original image was 1.42, and the average optical density of the twice toned image was 2.74.

Example 11

The toned, transferred image on polyethylene terephthalate film prepared as described in Example 10 was mounted on cylinder 26 of the apparatus of FIG. 2. It was then used as a master which was heated to about 82° C., toned with the prolonged tack toner, and the toner transferred to an aluminum plate of the type described in Example 7. After cooling, the image was retoned. This procedure was repeated a number of times producing multiple copies on separate aluminumpplates.

Example 12

Example 1 was repeatedeexcept that the toned image was transferred onto an aluminum plate of the type described in Example 7. The imaged plate was then treated with a solution of 3.5 g of triethanolamine titanate chelate and 21.5 g of water. The plate was then heated for 35 seconds, its surface reaching a temperature of at least 150° C., and was mounted on an A. B. Dick offset duplicator Model 350. 58,000 Inked impressions were made without showing any wear signs as demonstrated by its ability to hold 5% dots.

While in the above examples a latent image of the type having tacky and nontacky areas was used to illustrate this invention, it is possible to practice this invention starting from an electrostatic or electromagnetic latent image.

Example 13

A latent image is generated on a magnetic film using a magnetic head. It is then toned through the application of a prolonged tack toner of the composition:
 8.2 g polymethylmethacrylate/methacrylic acid
 14.8 g triphenyl phosphate
 23.0 g Fe₃O₄ powder sold by Pfizer Co. under the designation Product #MO7029

The developed magnetic image is then transferred onto a sheet of polyethylene terephthalate film by the application of pressure between two rollers forming a nip at a temperature of 45° C. The transferred image is then used as a master by mounting it on cylinder 26 of the apparatus of FIG. 2 and proceeding as described in Example 11.

The original magnetic film can be cleaned of any residual toner and reused to produce a new magnetic image as desired, circumventing the need for a consumable film for magnetic dry printing process.

Example 14

An electrostatic image was developed on a substrate using a mixture of 150 grams of steel balls (C 1018 steel REP powder, −70 to +100 mesh, Nuclear Metals, Inc., Concord, Mass.), and 2 grams of a prolonged tack toner having the following composition:

| Component | Parts |
| --- | --- |
| Polymethylmethacrylate/methacrylic acid described in Example 1 | 19.8 |
| Triphenyl phosphate | 73.6 |
| Quinacridone pigment (Harmon colors RV 6803 with 15.9% polyvinyl pyrrolidone dispersant) | 6.6 |

The toned electrostatic image was placed in contact with a plain, white sheet of paper and by grounding the image, toner was transferred imagewise onto the sheet. The transferred toned image on the paper sheet was then heated to above the melting point of the toner and placed in contact with a sheet of polyethylene terephthalate film base, 0.004 inch (0.10 mm) thick coated with a resin sublayer, whereupon through the application of pressure, the toned image exhibiting cohesive failure and partially transferred onto the polyethylene terephthalate base.

The transferred image on the base was then cooled and, while still tacky, retoned with a second prolonged tack toner having the following composition:

| Component | Parts |
| --- | --- |
| Polymethylmethacrylate/methacrylic acid described in Example 1 | 26.7 |
| Triphenyl phosphate | 66.7 |
| Quinacridone, polyvinyl pyrrolidone | 6.6 |

This retoned image on the polyethylene terephthalate base was again toned, heated, contacted with a lithographic aluminum sheet as described in Example 5, cooled, retoned, and the process repeated as disclosed in the previous examples, to produce at least four transfers of the original electrostatic image onto aluminum sheets.

I claim:
1. Process for image development of a substrate having a latent image, said image having toner-receptive and background areas, which comprises
 (a) applying to the latent image dry particles of a prolonged tack toner to produce a nontacky toned image, the prolonged tack toner comprising a thermoplastic polymer, and a plasticizer or heat activatable tackifying agent for the polymer present in an amount greater than its compatibility level in the polymer,
 (b) heating the toned image to a temperature sufficient to activate the toner by rendering the toner tacky,
 (c) reducing the temperature of the image below the activating temperature of the prolonged tack toner wherein the activated prolonged tack toner remains tacky,
 (d) further applying dry particles of prolonged tack toner to the tackified toned image, and
 (e) repeating steps (b) through (d) at least one time to increase the density of the toned image on the substrate.
2. A process according to claim 1 wherein the latent image results from electrostatic imaging.
3. A process according to claim 1 wherein the latent image resultsffrom electromagnetic imaging.
4. A process according to claim 1 wherein thelatent image toner-receptive areas are tacky and the background areas are nontacky.
5. A process for image development of a substrate having a latent image of tacky toner-receptive areas and nontacky background areas, said substrate being a supported photosensitive layer which is photopolymerizable containing at least one free radical initiated, chain propagating, addition polymerizable compound containing at least one terminal ethylenic group, and an addition polymerization initiator activatable by actinic radiation, the process which comprises

(a) applying to the latent image dry particles of a prolonged tack toner to produce a nontacky toned image, the prolonged tack toner comprising a thermoplastic polymer, and a plasticizer or heat activatable tackifying agent for the polymer present in an amount greater than its compatibility level in the polymer, (b) heating the toned image to a temperature sufficient to activate the toner by rendering the toner tacky, (c) reducing the temperature of the image below the activating temperature of the prolonged tack toner wherein the activated prolonged tack toner remains tacky, (d) further applying dry particles of prolonged tack toner to the tackified toned image, and (e) repeating steps (b) through (d) at least one time to increase the density of the toned image on the substrate.

6. A process for forming a toned image from a substrate master having a latent image, said image having toner-receptive and background areas, which comprises (a) applying to the latent image of the substrate dry particles of a prolonged tack toner to produce a nontacky toned image, the prolonged tack toner comprising a thermoplastic polymer, and a plasticizer or heat activatable tackifying agent for the polymer present in an amount greater than its compatibility level in the polymer, (b) heating the toned image to a temperature sufficient to activate the toner by rendering the toner tacky, (c) bringing the tacky toned substrate into intimate contact with an image receptor, and, while the toner is still activated, (d) separating the substrate and image receptor whereby a portion of the activated prolonged tack toner transfers imagewise to the image receptor, (e) reducing the temperature of the tackified toned image below the activating temperature of the prolonged tack toner wherein the toner remains tacky, (f) applying dry particulate prolonged tack toner over the remaining tacky toner on the substrate master, and (g) repeating steps (b) through (d) at least one time using a separate image receptor in step (c).

7. A process for forming a toned image from a substrate master having a latent image, said image having toner-receptive and background areas, which comprises (a) applying to the latent image of the substrate dry particles of a prolonged tack toner to produce a nontacky toned image, the prolonged tack toner comprising a thermoplastic polymer, and a plasticizer or heat activatable tackifying agent for the polymer present in an amount greater than its compatibility level in the polymer, (b) heating the toned image to a temperature sufficient to activate the toner by rendering the toner tacky, (c) bringing the tacky toned substrate into intimate contact with an image receptor, and, while the toner is still activated, (d) separating the substrate and image receptor whereby a portion of the activated prolonged tack toner transfers imagewise to the image receptor, (e) reducing the temperature of the prolonged tack toner transferred to the image receptor below the activating temperature of the prolonged tack toner, and (f) applying additional dry particulate prolonged tack toner over the still tacky image to increase the density of the toned transferred image.

8. A process according to claim 7 wherein steps (b) through (d) are repeated at least one time using a separate image receptor in step (c).

9. A process according to any one of claims 6, 7 or 8 wherein said latent image results from electrostatic imaging.

10. A process according to any one of claims 6, 7 or 8 wherein said latent image results from electromagnetic imaging.

11. A process according to any one of claims 6, 7 or 8 wherein said latent image toner-receptive areas are tacky and the background areas are nontacky.

12. A process for forming a toned image from a substrate master having a latent image, said image having toner receptive and background areas, said substrate master being a supported photosensitive layer which is photopolymerizable containing at least one free radical initiated, chain propagating, addition polymerizable compound containing at least one terminal ethylenic group, and an addition polymerization initiator activatable by actinic radiation, the process comprises (a) applying to the latent image of the substrate dry particles of a prolonged tack toner to produce a nontacky toned image, the prolonged tack toner comprising a thermoplastic polymer, and a plasticizer or heat activatable tackifying agent for the polymer present in an amount greater than its compatibility level in the polymer, (b) heating the toned image to a temperature sufficient to activate the toner by rendering the toner tacky, (c) bringing the tacky toned substrate into intimate contact with an image receptor, and, while the toner is still activated, (d) separating the substrate and image receptor whereby a portion of the activated prolonged tack toner transfers imagewise to the image receptor, (e) reducing the temperature of the tackified toned image below the activating temperature of the prolonged tack toner wherein the toner remains tacky, (f) applying dry particulate prolonged tack toner over the remaining tacky toner on the substrate master, and (g) repeating steps (b) through (d) at least one time using a separate image receptor in step (c).

13. A process for forming a toned image from a substrate master having a latent image having toner-receptive and background areas, which comprises (a) applying to the latent image of the substrate dry particles of a prolonged tack toner to produce a nontacky toned image, the prolonged tack toner comprising a thermoplastic polymer, and a plasticizer or heat activatable tackifying agent for the polymer present in an amount greater than its compatibility level in the polymer, (b) heating the toned image to a temperature sufficient to activate the toner by rendering the toner tacky, (c) bringing the tacky toned substrate into intimate contact with an image receptor, and while the toner is still activated, (d) separating the substrate and image receptor whereby a portion of the activated prolonged tack toner transfers imagewise to the image receptor, steps (a) to (d) being repeated up to four times using a substrate master having tacky toner-receptive areas and nontacky background areas on each of up to four substrates formed therein by exposure with actinic radiation through different color separation transparencies and the transfer step is accomplished by transferring in register toners of appropriate color with respect to the separation transparencies onto a single image receptor.

14. A process according to claim 6 wherein the image receptor is paper.

15. A process according to claim 6 wherein the image receptor is a copper clad laminate board which after image transfer is subsequently etched or plated to form a printed circuit.

16. A process according to claim 6 wherein the image receptor is an aluminum plate and after image transfer the image is heated at a temperature up to 150° C., treated with lithographic solutions and inked to provide inked impressions on separate image receptors.

17. A process according to claim 16 wherein after image transfer, while the image is still tacky and prior to heating, the toned image is retoned with polymer particles.

18. A process according to any one of claims 1, 5, 6 or 7 wherein the prolonged tack toner comprises polystyrene and N-cyclohexyl-p-toluenesulfonamide.

19. A process according to any one of claims 1, 5, 6 or 7 wherein the prolonged tack toner comprises a copolymer of methylmethacrylate and methacrylic acid and triphenyl phosphate plasticizer.

20. A process according to any one of claims 1, 5, 6 or 7 wherein the prolonged tack toner comprises styrene maleic anhydride copolymer and triethyleneglycol dibenzoate.

* * * * *